US012660183B2

(12) United States Patent
Ikariyama et al.

(10) Patent No.: US 12,660,183 B2
(45) Date of Patent: Jun. 16, 2026

(54) SEMICONDUCTOR DEVICE MANUFACTURING METHOD AND SEMICONDUCTOR DEVICE

(71) Applicant: Kioxia Corporation, Tokyo (JP)

(72) Inventors: Rikyu Ikariyama, Chigasaki Kanagawa (JP); Shinya Okuda, Yokkaichi Mie (JP); Takuya Konno, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 583 days.

(21) Appl. No.: 18/151,921

(22) Filed: Jan. 9, 2023

(65) Prior Publication Data

US 2024/0008273 A1 Jan. 4, 2024

(30) Foreign Application Priority Data

Jul. 1, 2022 (JP) ................................. 2022-106936

(51) Int. Cl.
H10B 43/27 (2023.01)
H10B 41/27 (2023.01)

(52) U.S. Cl.
CPC ............. H10B 43/27 (2023.02); H10B 41/27 (2023.02)

(58) Field of Classification Search
CPC ........ H10B 43/27; H10B 41/27; H10B 43/20; H10B 41/20
USPC ......................................................... 257/314
See application file for complete search history.

(56) References Cited

U.S. PATENT DOCUMENTS

2011/0303969 A1    12/2011  Kai
2012/0001247 A1     1/2012  Alsmeier

2014/0065810 A1*    3/2014  Son ........................ H10B 43/27
                                                              438/591
2015/0194441 A1     7/2015  Yatsuda
2017/0062458 A1*    3/2017  Sasaki .................... H10B 43/27
2020/0135754 A1*    4/2020  Lee ........................ H10B 43/10
2021/0013224 A1*    1/2021  Purayath .......... H01L 21/76877

(Continued)

FOREIGN PATENT DOCUMENTS

JP            H0567591 A      3/1993
JP          2002280388 A      9/2002
JP          2012004249 A      1/2012

OTHER PUBLICATIONS

Yusuke Fukunaga et al., "Narrow free-standing features fabricated by top-down self-limited trimming of organic materials using precisely temperature-controlled plasma etching system", Department of Electrical Engineering and Computer Science, Graduate School of Engineering, Nagoya University, Japanese Journal of Applied Physics 58, 020906 (2019), 6 pages, https://doi.org/10.7567/1347-4065/aaf92a.

*Primary Examiner* — Moazzam Hossain

(74) *Attorney, Agent, or Firm* — Kim & Stewart LLP

(57) ABSTRACT

According to one embodiment, a semiconductor device manufacturing method includes forming a stacked film with alternating first-type sacrificial layers and second-type sacrificial layers, then removing the first-type sacrificial layers from the stacked film to leave the second-type sacrificial layers with spaces therebetween. The second-type sacrificial layers are then each replaced with an insulating layer after removing the first-type sacrificial layers. After the second-type sacrificial layers are replaced with the insulating layer, a conductive layer is formed inside the spaces formed by removing the first-type sacrificial layers.

12 Claims, 19 Drawing Sheets

(56) References Cited

U.S. PATENT DOCUMENTS

| | | | |
|---|---|---|---|
| 2021/0083128 A1 | 3/2021 | Noguchi | |
| 2021/0272979 A1 | 9/2021 | Noguchi | |
| 2021/0335610 A1 | 10/2021 | Watanabe | |
| 2022/0045096 A1 | 2/2022 | Ryu | |
| 2022/0238347 A1* | 7/2022 | Kim | H01L 21/31144 |
| 2022/0399367 A1* | 12/2022 | Kim | H10B 43/10 |
| 2023/0143057 A1* | 5/2023 | Hoang | H10B 51/20 |
| | | | 257/295 |
| 2024/0155839 A1* | 5/2024 | Byeon | H01L 21/02164 |
| 2024/0422981 A1* | 12/2024 | Wu | H01L 24/00 |

* cited by examiner

Figure 4:
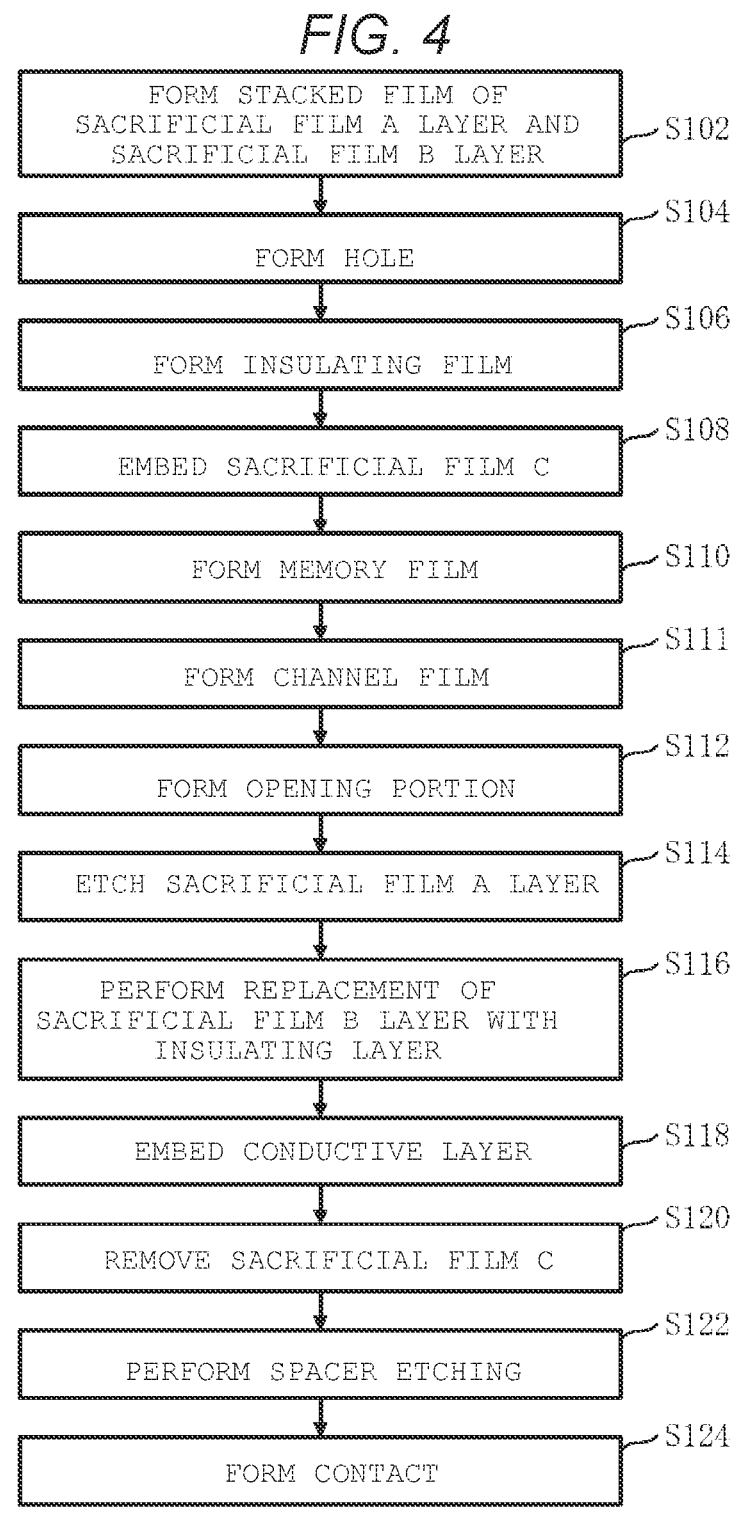

FORM STACKED FILM OF
SACRIFICIAL FILM A LAYER AND
SACRIFICIAL FILM B LAYER ⟶ S102

FORM HOLE ⟶ S104

FORM INSULATING FILM ⟶ S106

EMBED SACRIFICIAL FILM C ⟶ S108

FORM MEMORY FILM ⟶ S110

FORM CHANNEL FILM ⟶ S111

FORM OPENING PORTION ⟶ S112

ETCH SACRIFICIAL FILM A LAYER ⟶ S114

PERFORM REPLACEMENT OF
SACRIFICIAL FILM B LAYER WITH
INSULATING LAYER ⟶ S116

EMBED CONDUCTIVE LAYER ⟶ S118

REMOVE SACRIFICIAL FILM C ⟶ S120

PERFORM SPACER ETCHING ⟶ S122

FORM CONTACT ⟶ S124

20(21)     SiO₂

BENDING

WARPING

EFFECT OF CHARGE-UP
IN HOLE

E/R (nm/min)

INSULA-
TING FILM
(WITHOUT
CONDUC-
TIVE
FILM)

WITH
CONDUC-
TIVE FILM

SEMICONDUCTOR DEVICE MANUFACTURING METHOD AND SEMICONDUCTOR DEVICE

CROSS-REFERENCE TO RELATED APPLICATION

This application is based upon and claims the benefit of priority from Japanese Patent Application No. 2022-106936, filed Jul. 1, 2022, the entire contents of which are incorporated herein by reference.

FIELD

Embodiments described herein relate generally to a semiconductor device manufacturing method and a semiconductor device.

BACKGROUND

In semiconductor device development, and semiconductor storage device development in particular, miniaturization is pursued to achieve increases in capacity, cost reductions, and so on. Development of three-dimensional NAND flash memory devices with three-dimensionally arranged memory cells is in progress. In a three-dimensional NAND flash memory device, a NAND string is formed in which memory cells are connected to word line layers stacked via an insulating layer in the direction perpendicular to the word line layer surface (vertical direction). As a result, higher integration can be achieved than when memory cells are just arranged two-dimensionally.

As a method of forming a three-dimensional NAND flash memory device, a film stack can be formed in which sacrificial film layers alternate with insulating layers. Then, after removing the sacrificial film layers from the stack, a word line layer can be formed in the space left by the removal. In this process, there is a problem that the remaining insulating layers may be bent or warped after the removal of the sacrificial film layers.

BRIEF DESCRIPTION OF THE DRAWINGS

FIG. 3 is a cross-sectional view illustrating another aspect of a semiconductor device according to a first embodiment.

FIG. 4 is a flowchart of a semiconductor device manufacturing method according to a first embodiment.

FIG. 16 depicts steps related to replacement of a sacrificial film layer with an insulating layer according to a first embodiment.

FIG. 20 is a diagram illustrating an example of etching rates according to a first embodiment.

DETAILED DESCRIPTION

In general, according to one embodiment, a semiconductor device manufacturing method includes forming a stacked film with alternating first-type sacrificial layers and second-type sacrificial layers, then removing the first-type sacrificial layers from the stacked film to leave the second-type sacrificial layers with spaces therebetween. The second-type sacrificial layers are then each replaced with an insulating layer after removing the first-type sacrificial layers. After the second-type sacrificial layers are replaced with the insulating layer, a conductive layer is formed inside the spaces formed by removing the first-type sacrificial layers.

In a particularly described example, a three-dimensional NAND flash memory device will be described as one, non-limiting example of a semiconductor device.

First Embodiment

Figure 1:
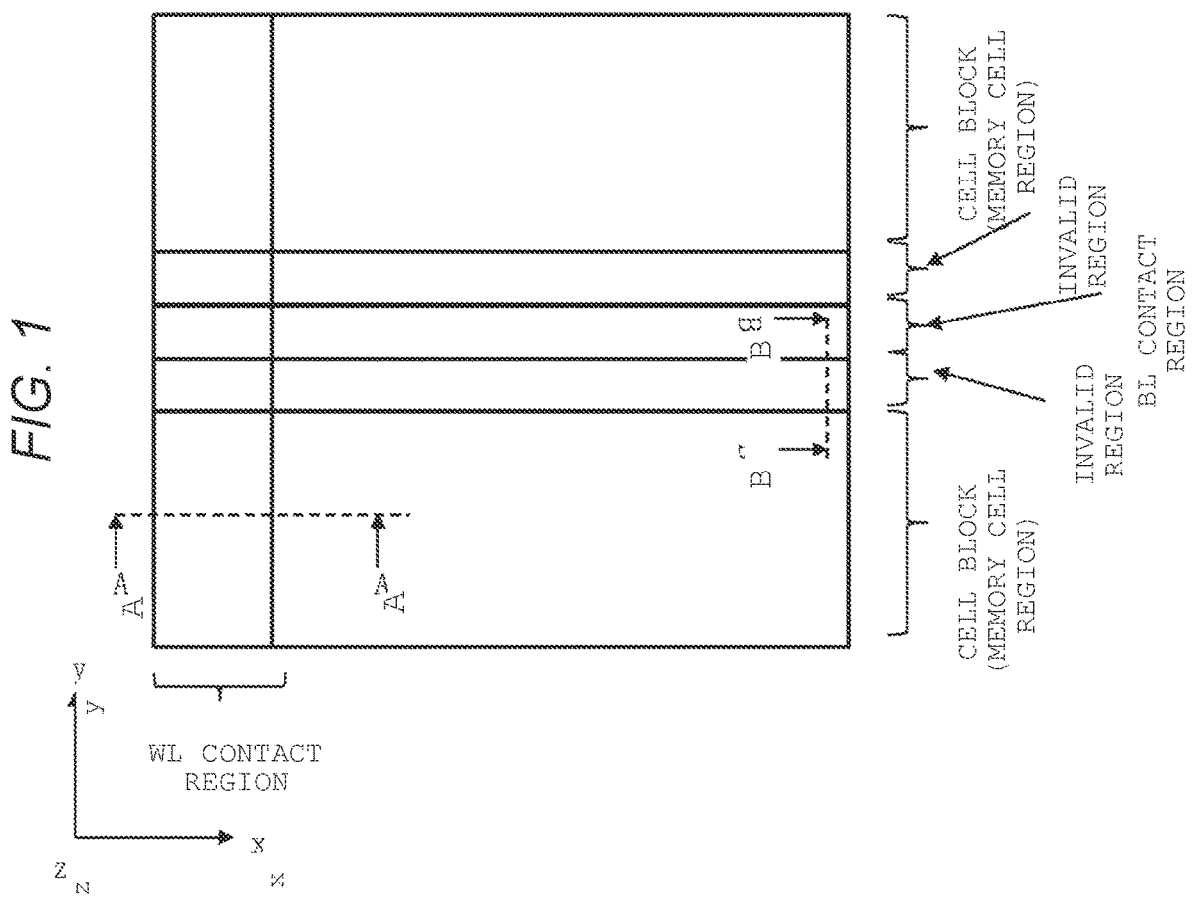
FIG. 1 is a top view illustrating a part of a semiconductor device according to a first embodiment.

FIG. 1 is a top view illustrating a part of the configuration of a semiconductor device according to a first embodiment. The example of FIG. 1 illustrates a part of a memory cell array. In the example of FIG. 1, two cell blocks (memory cell regions), a bit line (BL) contact region, two invalid regions, and a word line (WL) contact region are illustrated. The two cell blocks are separated from each other in the y direction. The BL contact region is disposed between the two cell blocks with invalid regions on either side. A plurality of memory cells are disposed in each cell block. A "through contact" for electrically connecting a peripheral circuit for the memory cell array and a bit line is disposed in the BL contact region. In addition, the WL contact region is disposed on an x-direction end portion (or, in other examples, an x-direction middle portion) for each cell block. A contact for connecting each word line to the peripheral circuit is disposed in the WL contact region.

Figure 2:
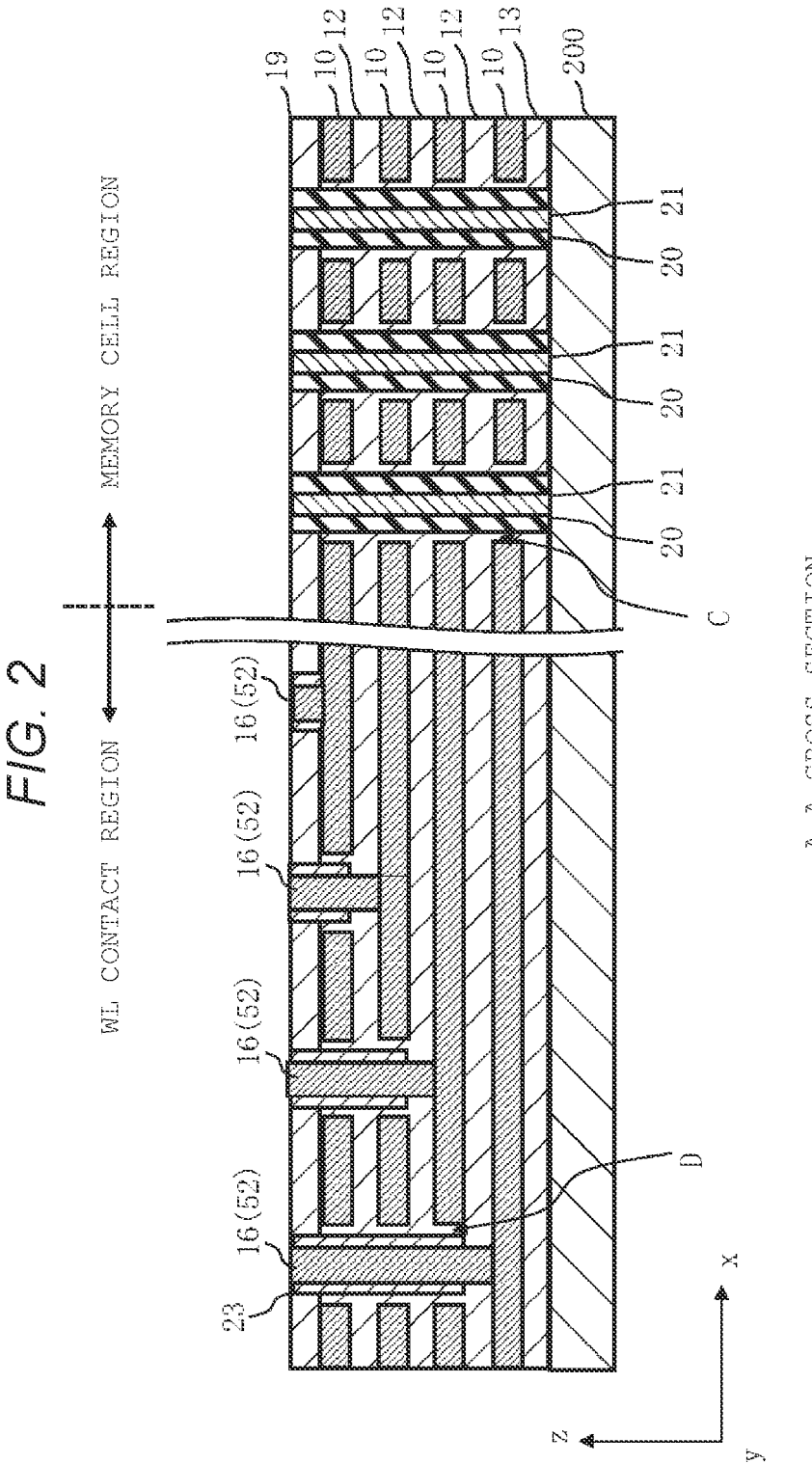
FIG. 2 is a cross-sectional view of a semiconductor device according to a first embodiment.

FIG. 2 is a cross-sectional view illustrating an example of the configuration of the semiconductor device according to the first embodiment. FIG. 2 illustrates a cross section at the A-A cross section line in FIG. 1. In the semiconductor device according to the first embodiment, the plurality of the conductive layers 10 are mutually separated and stacked to form word lines and an insulating layer 12 is between the conductive layers 10 adjacent in the z direction. The conductive layers 10 and the insulating layers 12 are alternately stacked with each other on a lower layer wiring 200. Each conductive layer 10 is a plate-shaped layer extending in the x and y directions. The conductive layers 10 so span the WL contact region and the memory cell region. In the example of FIG. 2, an insulating layer 13 is first disposed on the lower layer wiring 200, and the lowermost first conductive layer 10 is disposed on the insulating layer 13. Subsequently, a stacked film of the insulating layers 12 and the conductive layers 10 is formed. The uppermost conductive layer 10 is covered with an insulating layer 19.

In FIG. 2, a plurality of contacts 16 penetrate different numbers of conductive layers 10 in the WL contact region. These contacts 16 are each electrically connected to different conductive layers 10 among the plurality of conductive layers 10. In this manner, the stacked body of the plurality of conductive layers 10 and the plurality of insulating layers 12 is not processed into a staircase (or terrace) shape in the WL contact region, and the same total number of layers is thus maintained at the position of connection of each contact 16.

A barrier metal film 52 of titanium nitride (TiN) or the like can be disposed on the side wall and the bottom surface of each contact 16. Each contact 16 is connected to a conductive layer 10 via the barrier metal film 52 disposed on the bottom surface of the contact 16. In the example of FIG. 2, four conductive layers 10 are illustrated along with the four contacts 16 that are respectively connected to these conductive layers 10. However, the number of conductive layers 10 is not limited this depicted example. In general, it is preferable that more conductive layers 10 are stacked in the z direction than just four. With additional stacked conductive layers 10, additional contacts 16 are respectively connected provided in a similar manner as depicted in FIG. 2.

In the depicted example, the contact 16 connected to the first conductive layer 10 (as counted from the lower layer side) penetrates the three upper conductive layers 10. The contact 16 connected to the second conductive layer 10 (from the lower layer side) penetrates two conductive layers 10. The contact 16 connected to the third conductive layer 10 (from the lower layer side) penetrates one other conductive layer 10.

An insulating film 23 is disposed via the barrier metal film 52 on the side surface of each contact 16, and electrical insulation is thus provided between the contacts 16 and the respectively penetrated conductive layers 10. In this example, a conductive material such as tungsten (W) is used as the material of each contact 16.

In the first embodiment, a portion (portion D) of the insulating layers 12 is disposed between the insulating film 23 formed on the side wall side of each contact 16 and the penetrated conductive layers 10. Since this portion D is provided, the overall insulating material thickness between contacts 16 and the conductive layers 10 can be increased as compared with a case where just the insulating film 23 is provided alone, and thus the electrical insulation between each contact 16 and the penetrated conductive layers 10 can be improved.

Here, the example of FIG. 2 illustrates a configuration in which each contact 16 penetrates conductive layers 10 to reach the conductive layer 10 to which the contact 16 is electrically connected, but the present disclosure is not limited thereto. In the WL contact region, the stacked body of the plurality of conductive layers 10 and the plurality of insulating layers 12 may be processed into a staircase or terrace shape in other examples.

In the memory cell region, columnar channel bodies 21 penetrate the stacked body formed of conductive layers 10 and insulating layers 12, 13, and 19. The columnar channel bodies 21 extend in the stacking direction (z direction). A semiconductor material is used for the channel body 21. A memory film 20 including a charge storage film is disposed between each conductive layer 10 and the channel body 21 in the memory cell region. The memory film 20 is a tubular shape surrounding an outer surface of the channel body 21 and penetrates the conductive layers 10 and the insulating layers 12, 13, and 19. One memory cell is formed at the intersection of a conductive layer 10 (serving as a word line) and the channel body 21 (surrounded by the memory film 20). It is noted that as for the columnar channel body 21, a tubular structure having a bottom portion may be formed using a semiconductor material and a core formed of an insulating material may be disposed inside the tubular structure.

In the first embodiment, an insulating film (C portion) formed integrally with the insulating layer 12 is disposed between the memory film 20 and the conductive layer 10. In the present example, a portion (portion C) of insulating layers 12 functions as a part of the block insulating film of the memory film 20.

One NAND string includes a plurality of memory cells connecting the memory cells formed in the conductive layers 10 penetrated by the same channel body 21 and memory film 20. A plurality of the channel bodies 21 and the memory films 20 surrounding the channel bodies 21 are disposed in each conductive layer 10. A combination of three channel bodies 21 and three memory films 20 is illustrated in the example of FIG. 2.

One end of each channel body 21 is connected to a bit line contact or the like and then to a bit line in a layer disposed above the stacked body. The other end of each channel body 21 is connected in to the lower layer wiring 200, which is a layer below the stacked body and serves as a source line (SL) (common source line) in the semiconductor device.

In some examples, one or more of the uppermost and lowermost conductive layers 10 in the stack body may serve as a select gate line.

Figure 3:
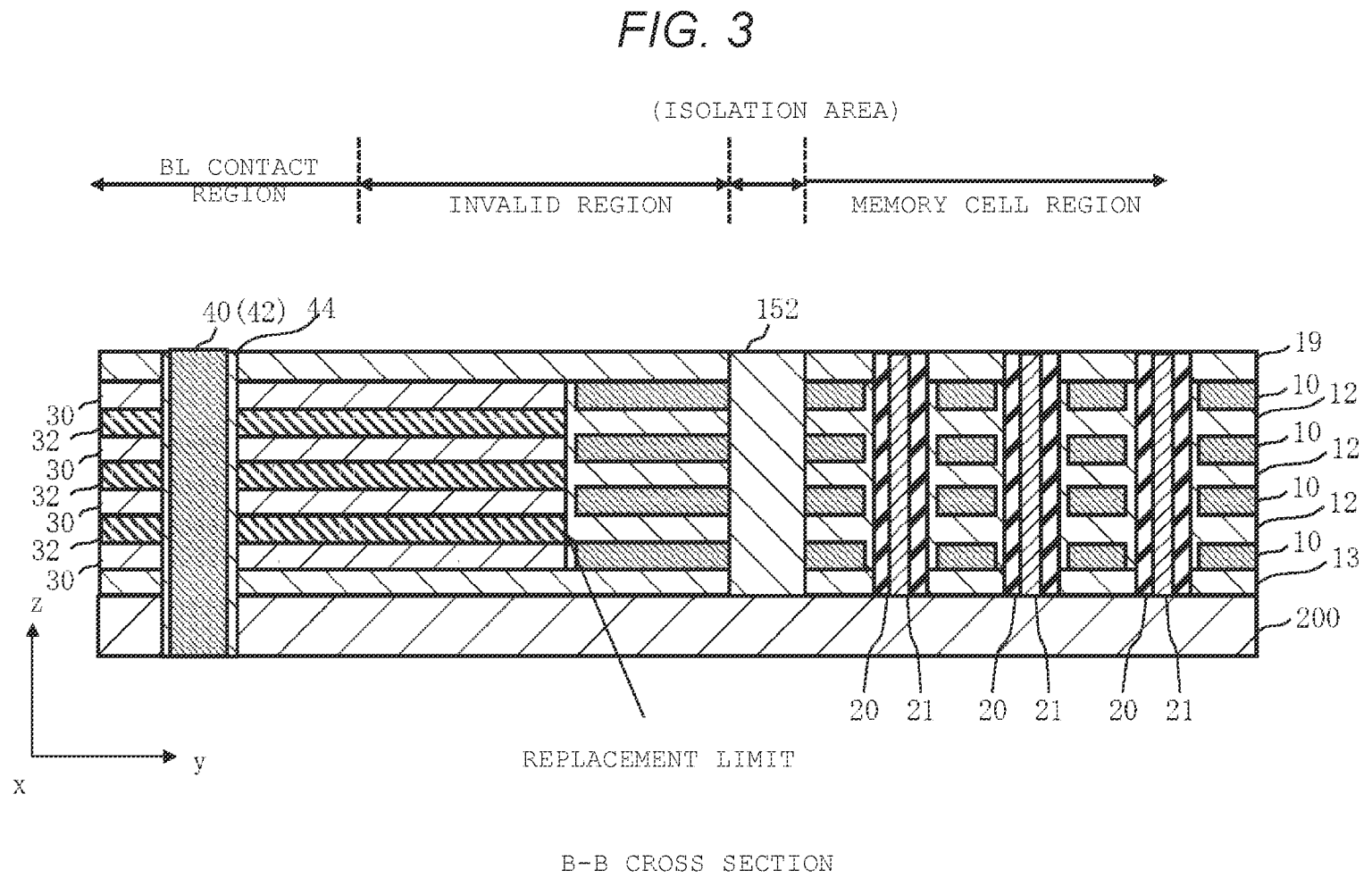

FIG. 3 is a cross-sectional view illustrating another aspect of the semiconductor device according to the first embodiment. The example of FIG. 3 illustrates an example at the B-B cross section line in FIG. 1. FIG. 3 illustrates a cell block end portion, an invalid region, and a part of a BL contact region. Overall configuration in the cell block is as described above. The wall of an insulating film 152 (isolation area) is disposed at the boundary between the cell block and an invalid region and serves to isolate (electrically separate) the two regions.

Although the example of FIG. 3 illustrates a case where the isolation area is filled with the insulating film 152, the present disclosure is not limited thereto. In some examples, a conductive member can be embedded in the insulating film 152. The conductive member can be electrically isolated from each of the conductive layers 10 by the insulating film 152. The bottom portion of the conductive member can be electrically connected to the lower layer wiring 200 and thus functions as a source line contact or the like in the semiconductor storage device.

In the invalid region, a stacked body of conductive layers 10 and insulating layers 12 is adjacent to a stacked body of sacrificial film 30 layers and sacrificial film 32 layers in the y direction. The stacked body of conductive layers 10 and insulating layers 12 is disposed on the memory cell region side. The stacked body of sacrificial film 30 layers and sacrificial film 32 layers is disposed on the BL contact region side. Silicon nitride (SiN) or the like is preferably used as the material of the sacrificial film 30 layer (e.g., a nitride film layer). Carbon or the like is preferably used as the material of the sacrificial film 32 layer (e.g., a carbon film layer). As for the sacrificial film 30 layers, each one is formed at the same height position as a corresponding one of the conductive layers 10. As for the sacrificial film 32 layers, each one is formed at the same height position as a corresponding one of the insulating layer 12.

A plurality of contacts 40 arranged along the x direction are disposed in the BL contact region. The plurality of contacts 40 penetrate the stacked film of the sacrificial film 30 layers and sacrificial film 32 layers along with the insulating films 13 and 19, and the lower layer wiring 200. The plurality of contacts 40 are connected to a peripheral circuit formed below the lower layer wiring 200. For example, various elements such as transistors and wiring are formed in or on the semiconductor substrate below the lower layer wiring 200 to function as a part of the peripheral circuit of the memory cell array. A barrier metal film 42 of TiN (titanium nitride) or the like is disposed on the side wall and the bottom surface of each contact 40. An insulating film 44 is disposed on the barrier metal film 42 on the side wall of each contact 40. When a sacrificial film 32 is a conductive film such as a carbon film, the insulating film 44 provides electrical insulation from the sacrificial films 32 penetrated by each contact 40. A conductive material such as tungsten (W) can be used as the material of each contact 40.

It may be preferable that an aluminum oxide film ($Al_2O_3$) or the like be interposed between each of the insulating layers 12, 13, and 19 and the adjacent conductive layers 10. In such a case, the aluminum oxide film is also formed between the insulating film (portion C) on the side surface of the memory film 20 and the insulating film (portion D) on the side wall of the contact 16 and each conductive layer 10. The aluminum oxide film is not separately illustrated in FIGS. 2 and 3 but may be considered part of the respective insulating film portions or the like.

FIG. 4 is a flowchart illustrating main steps of a semiconductor device manufacturing method according to the first embodiment. In FIG. 4, a sacrificial film A layer-sacrificial film B layer stacked film forming step (S102), a hole forming step (S104), an insulating film forming step (S106), a sacrificial film C embedding step (S108), a memory film forming step (S110), a channel film forming step (S111), an opening forming step (S112), a sacrificial film A layer etching step (S114), a sacrificial film B layer/insulating layer replacement step (S116), a conductive layer embedding step (S118), a sacrificial film C removal step (S120), a spacer etching step (S122), and a contact forming step (S124) are performed as a series of steps.

Figure 5:
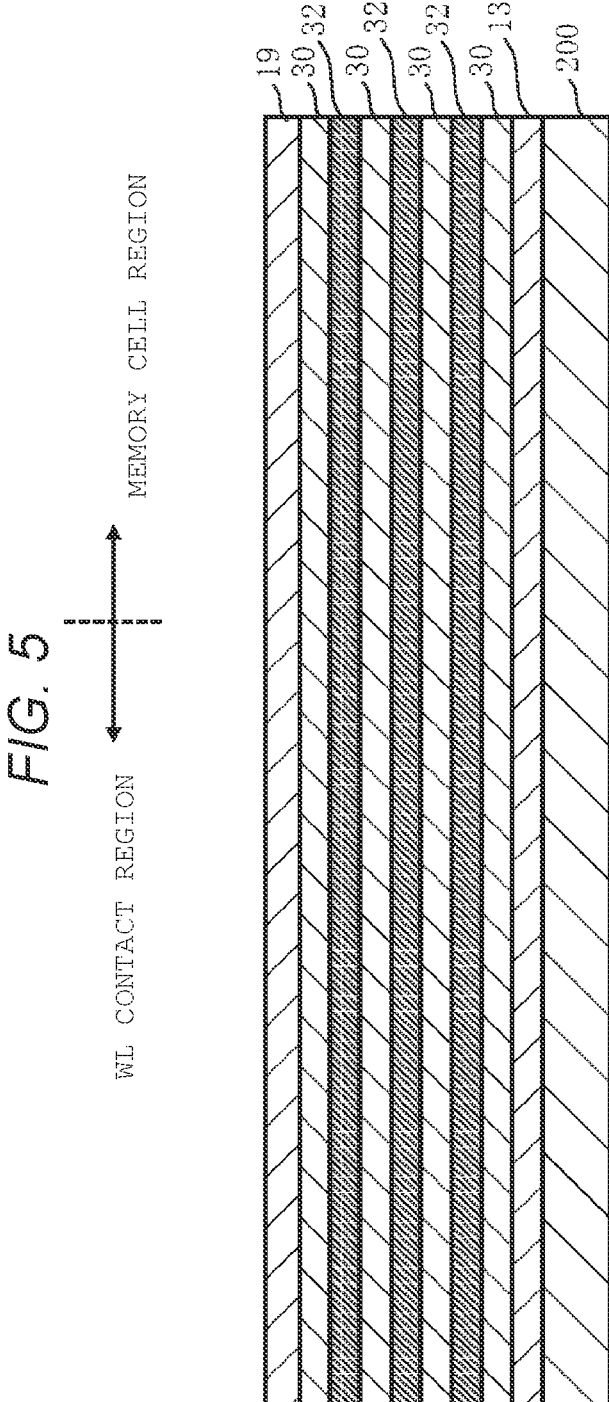
FIGS. 5 to 9 are cross-sectional views illustrating aspects of a semiconductor device manufacturing method according to a first embodiment.

FIG. 5 is a cross-sectional view illustrating certain steps of the semiconductor device manufacturing method according to the first embodiment. FIG. 5 illustrates the sacrificial film A layer-sacrificial film B layer stacked film forming step (S102).

In FIG. 5, as the sacrificial film A layer-sacrificial film B layer stacked film forming step (S102), a sacrificial film (sacrificial film A) layer and a sacrificial film 32 (sacrificial film B) layer are alternately stacked on the lower layer wiring 200 by, for example, atomic layer deposition (ALD), atomic layer chemical vapor deposition (ALCVD), or chemical vapor deposition (CVD). In the example of FIG. 5, the insulating layer 13 is formed first on the lower layer wiring 200 on an insulating layer (not separately depicted from the lower layer wiring 200) and then the sacrificial film 30 layer and the sacrificial film 32 layer are alternately stacked. A silicon wafer with a diameter of 300 mm or the like can be used as a semiconductor substrate on which the lower layer wiring 200 is formed. The insulating layer 19 is formed on the uppermost sacrificial film 30 layer. It is preferable to use silicon oxide ($SiO_2$) as the material of the insulating layers 13 and 19. It may be preferable to use a SiN (silicon nitride) film for the sacrificial film 30 layer. In addition, it may be preferable to use a carbon film as the sacrificial film 32 layer.

Figure 6:
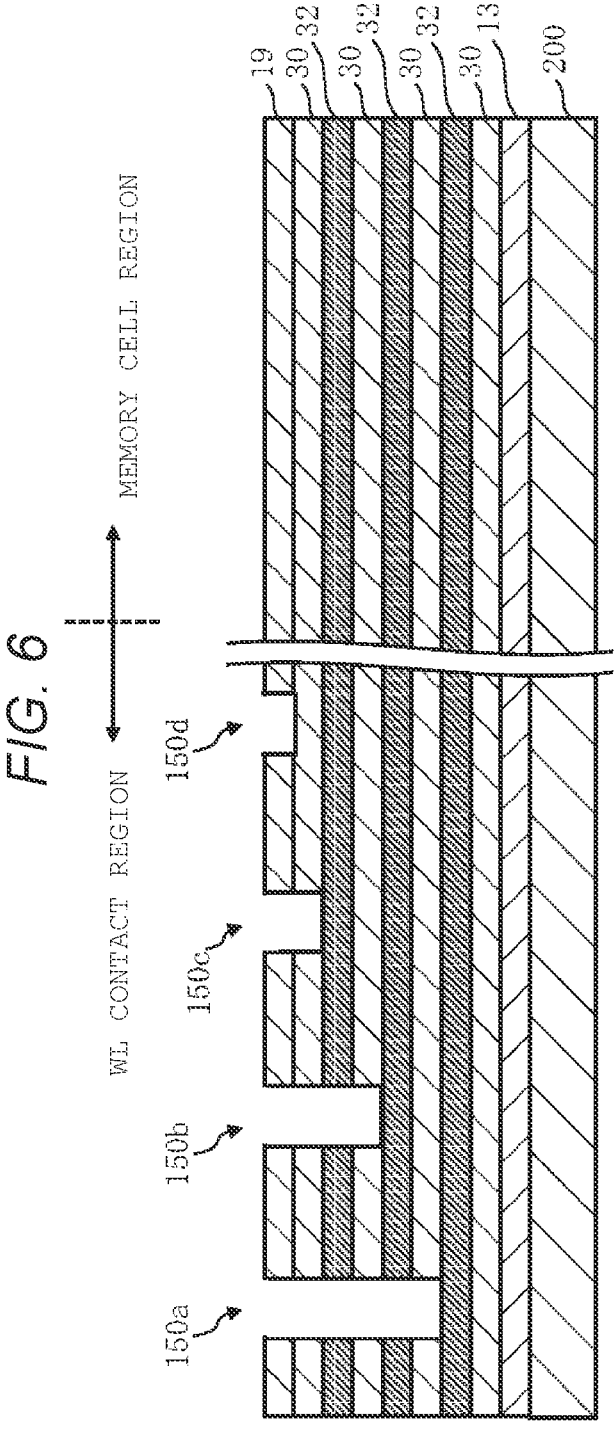

FIG. 6 is a cross-sectional view partially illustrating the steps of the semiconductor device manufacturing method according to the first embodiment. FIG. 6 illustrates the hole forming step (S104).

In FIG. 6, as the hole forming step (S104), openings (holes) having, for example, a circular cross section and penetrating a part of the stacked film of the sacrificial films 30 and the sacrificial films 32 described above is formed from above. Here, a plurality of holes 150a to 150d for contact formation are formed in the region that will become the WL contact region later. In addition, although not illustrated in FIG. 6, it is also generally preferable to simultaneously form a plurality of memory holes in the memory cell region. However, the plurality of holes 150a to 150d for contact formation and the plurality of memory holes may be separately formed without being limited to collective formation. The present example uses separate formation.

Specifically, with respect to a state where a resist film is formed on the insulating layer 19 by a photolithography step such as resist application and exposure steps, a contact hole substantially perpendicular to the front surface of the insulating layer 19 can be formed by removing the exposed insulating layer 19 and the stacked film of the sacrificial film 30 layer and the sacrificial film 32 layer positioned therebeneath by anisotropic etching. For example, the contact holes 150a to 150d may be formed by reactive ion etching (RIE).

For example, a resist pattern can be formed such that the positions of the contact holes 150a to 150d are open. Then, the exposed portions of the insulating layer 19 are etched. Then, a resist pattern can be formed such that the positions of the contact hole 150a and the contact hole 150c are open. Then, one layer of the sacrificial film 30 is etched from the upper layer side of the stacked film at positions corresponding to the contact holes 150a and 150c. Then, the resist pattern is removed by asking. Next, another resist pattern is formed such that the positions of the contact hole 150a and the contact hole 150b are open. Then, two layers of the sacrificial film 30 and the sacrificial film 32 therebetween are etched at the positions for the contact holes 150a and 150b. Then, the resist pattern is removed. As a result, the contact hole 150a can reach the sacrificial film 32 adjacent on the lowermost sacrificial film 30. The contact hole 150b can reach the sacrificial film 32 adjacent on the second sacrificial film 30 from the lower layer side. The contact hole 150c can reach the sacrificial film 32 adjacent on the third sacrificial film 30 from the lower layer side. The contact hole 150d can reach the fourth sacrificial film 30 from the lower layer side. In this manner, the contact holes 150a to 150d for four layers can be formed by etching the insulating layer 19 and then etching the stacked film twice. As a result, the contact holes 150a to 150d for the respective conductive layers 10 can be formed with fewer etchings than in a case where the contact holes for each of the respective conductive layers 10 are individually opened.

Figure 7:
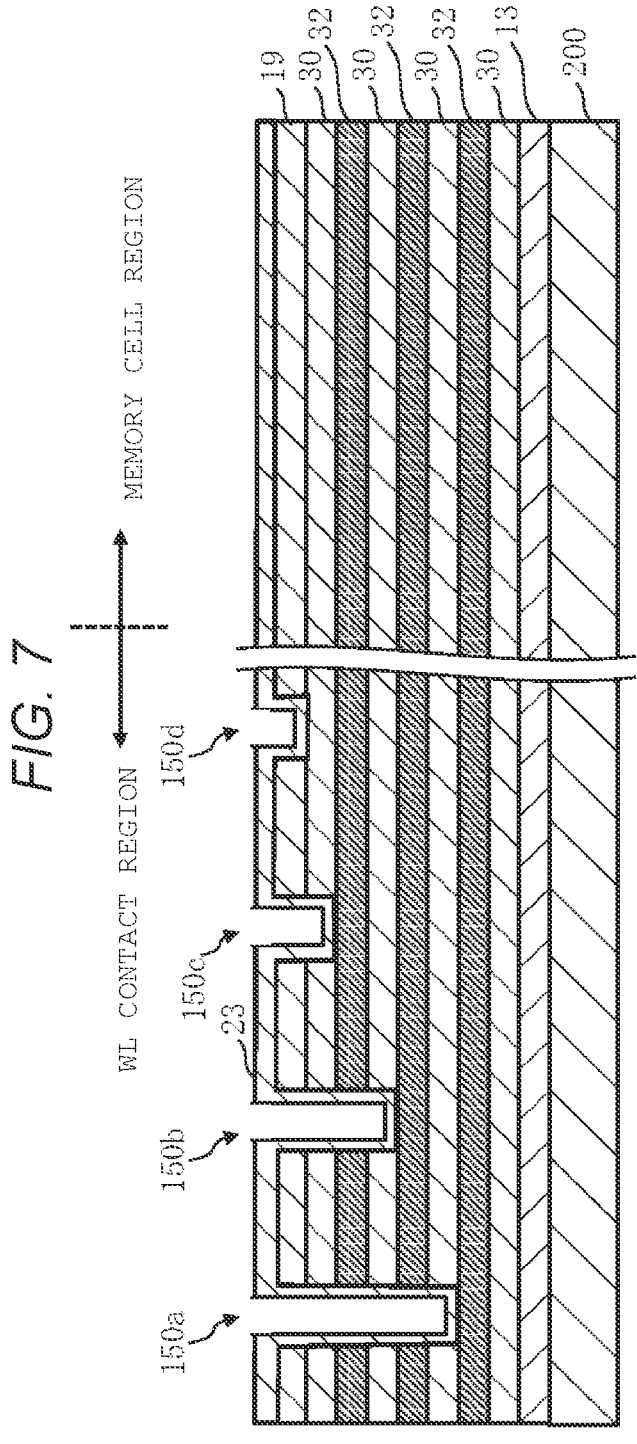

FIG. 7 is a cross-sectional view illustrating additional steps of the semiconductor device manufacturing method according to the first embodiment. FIG. 7 illustrates the insulating film forming step (S106).

In FIG. 7, as the insulating film forming step (S106), the insulating film 23 is formed on the upper surface of the insulating layer 19 and the side walls and the bottom surfaces of the contact holes 150a to 150d by, for example, CVD. It is preferable to use SiO$_2$ as the material of the insulating film 23. The insulating film 23 formed on the side wall eventually functions as the insulating film 23 positioned between the contacts 16 and the penetrated conductive layers 10.

Figure 8:
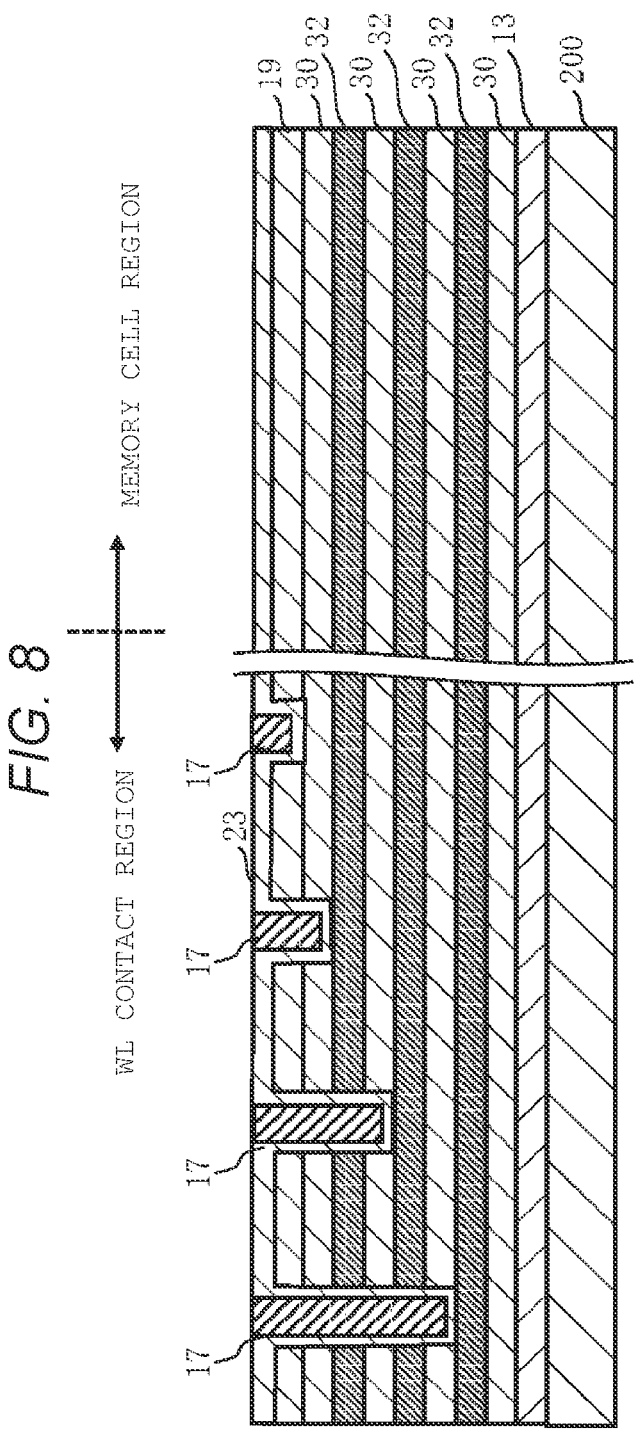

FIG. 8 is a cross-sectional view illustrating additional steps of the semiconductor device manufacturing method according to the first embodiment. FIG. 8 illustrates the sacrificial film C embedding step (S108).

In FIG. 8, as the sacrificial film C embedding step (S108), a sacrificial film 17 (sacrificial film C) is filled into the contact holes 150a to 150d by, for example, CVD. It is preferable to use, for example, amorphous silicon (a-Si) as the material of the sacrificial film 17. A material having etching resistance contrast with the insulating film 23 is used as the material of the sacrificial film 17.

Figure 9:
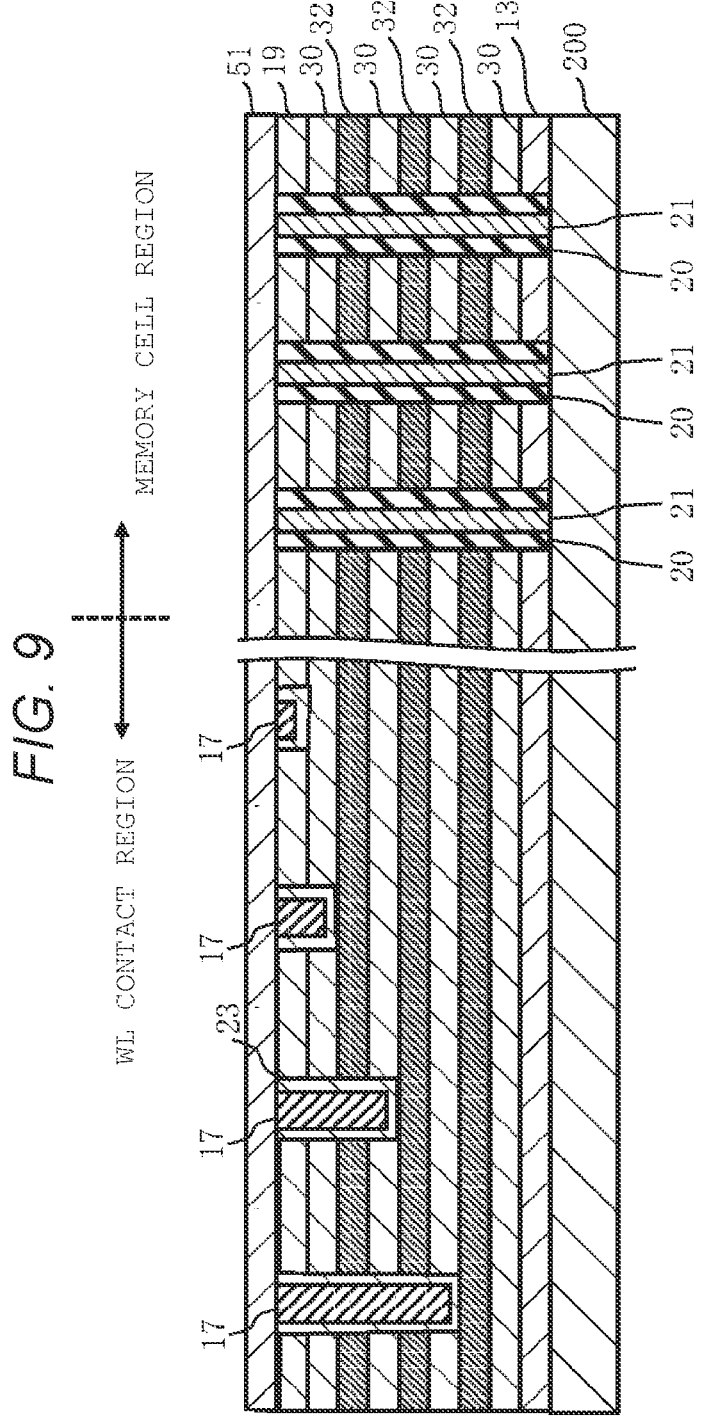

FIG. 9 is a cross-sectional view illustrating additional steps of the semiconductor device manufacturing method according to the first embodiment. FIG. 9 illustrates the memory film forming step (S110) and the channel film forming step (S111).

In FIG. 9, as the memory film forming step (S110), a plurality of memory holes are initially formed penetrating the insulating layer 19 (which may also be integrated with the insulating film 23) to the insulating layer 13 in the memory cell region.

The memory holes, substantially perpendicular to the upper surface of the insulating layer 19, can be formed using a photolithography step or the like that forms a resist mask leaving corresponding portions of insulating layer 19 exposed, the stacked film of the sacrificial film 30 layer and the sacrificial film 32 layer positioned therebeneath, and the insulating layer 13 can be removed by anisotropic etching. For example, the memory holes may be formed by reactive ion etching (RIE).

Then, the memory film 20 is formed inside each of the memory holes.

Figure 10:
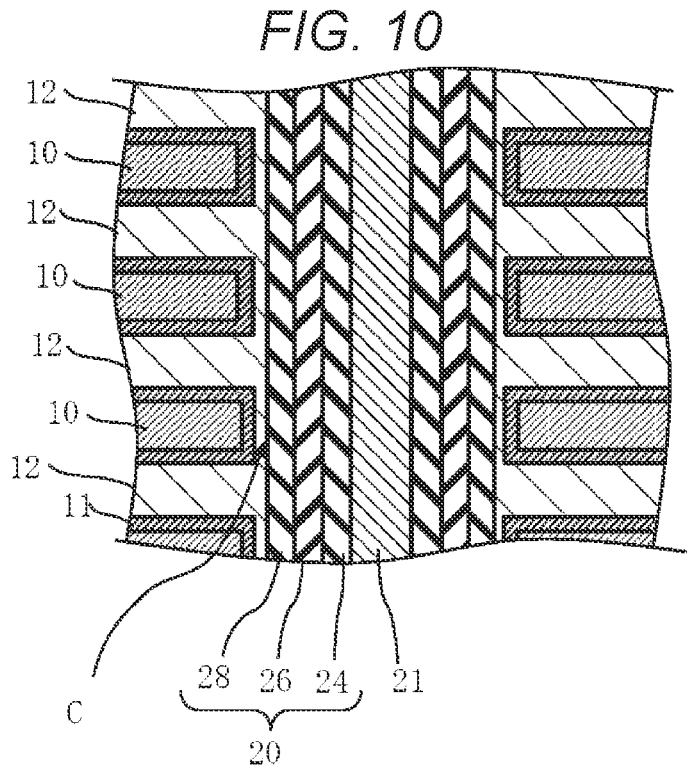
FIG. 10 is a cross-sectional view of a memory cell region according to a first embodiment.

FIG. 10 is a cross-sectional view illustrating an example of the configuration of the memory cell region according to the first embodiment. FIG. 10 illustrates a state after the sacrificial film 30 layer has been replaced with the conductive layer 10 (inclusive of barrier metal film 11). FIG. 10 illustrates a state after the sacrificial film 32 layer has been replaced with the insulating layer 12. The memory film 20 includes a block insulating film 28, a charge storage film 26, and a tunnel insulating film 24. Formation steps for these aspects will be more specifically described below.

As a block film forming step, the block insulating film 28 is formed along the side wall surface of each memory hole by, for example, ALD, ALCVD, or CVD. The block insulating film 28 is a film preventing charge flow between the charge storage film 26 and the conductive layer 10. Aluminum oxide (Al$_2$O$_3$), a SiO$_2$ film, or the like is preferably used as the material of the block insulating film 28. As a result, the block insulating film 28 disposed along the side wall surface of the memory hole can be formed as a part of the memory film 20.

Next, as a charge storage film forming step, the charge storage film 26 is formed along the side wall surface of the block insulating film 28 in each memory hole by, for example, ALD, ALCVD, or CVD. The charge storage film 26 is a film containing a material capable of storing charges. Silicon nitride (SiN) or the like is preferably used as the material of the charge storage film 26. As a result, the charge storage film 26 disposed along the inner wall surface of the block insulating film 28 can be formed as a part of the memory film 20.

Next, as a tunnel insulating film forming step, the tunnel insulating film 24 is formed along the side wall surface of the charge storage film 26 in each memory hole by, for example, ALD, ALCVD, or CVD. The tunnel insulating film 24 is an insulating film that allows a current to flow when a predetermined voltage is applied across the film. It is preferable to use, for example, SiO$_2$ or silicon oxynitride (SiON) as the material of the tunnel insulating film 24. As a result, the tunnel insulating film 24 disposed along the inner wall surface of the charge storage film 26 can be formed as a part of the memory film 20.

Although the above example illustrates a case where the block insulating film 28 is formed before the charge storage film 26 is formed, the present disclosure is not limited thereto. The charge storage film 26 and the tunnel insulating film 24 may be formed in the memory film forming step (S110), and the block insulating film 28 may be formed via a replacement groove (to be described more fully below) before embedding the barrier metal film and the conductive material in the conductive layer embedding step (S118).

Alternatively or in addition, the charge storage film 26 and the tunnel insulating film 24 may be formed in the memory film forming step (S110) and the insulating film (portion C) formed in the sacrificial film B layer/insulating layer replacement step (S116) may be used as the block insulating film 28.

Next, as the channel film forming step (S111), a columnar channel film serving as the channel body 21 is formed along the inner wall surface of the tunnel insulating film 24 in each memory hole by, for example, ALD, ALCVD, or CVD. A semiconductor material is used as the material of the channel film. For example, it is preferable to use impurity-doped silicon (Si). As a result, the columnar channel body 21 can be formed along the entire circumference of the inner wall surface of the tunnel insulating film 24.

It is preferable to form a protective film 51 (see FIG. 9) after performing a flattening by chemical mechanical polishing (CMP) on the stacked body after the memory film 20 and the channel body 21 have been formed. It is preferable to use, for example, SiO$_2$, as the material of the protective film 51. Preferably, the protective film 51 is formed in the WL contact region as well as the memory cell region.

As the opening forming step (S112), a plurality of groove-shaped openings are formed in order to separate the plate-shaped conductive layers 10 in the y direction. The plurality of openings (grooves) are formed penetrating the protective film 51 to the insulating layer 13. For example, the groove where the insulating film 152, which forms the isolation area separating the memory cell region and the invalid region as depicted in FIG. 3, is to be embedded corresponds to one of the groove openings formed in this step. That is, the insulating film 152 is eventually formed (embedded) inside one of the groove openings.

The grooves (trenches) can be formed using a photolithography process or the like to form a resist mask on the protective film 51 with openings corresponding to the intended positions of the grooves (trenches) followed by etching of the protective film 51, the insulating layer 19, and the stacked film of the sacrificial film 30 layers and the sacrificial film 32 layers positioned therebeneath, along with the insulating layer 13 by anisotropic etching. For example, the plurality of openings (grooves or the like) may be formed by reactive ion etching (RIE).

Figure 11:
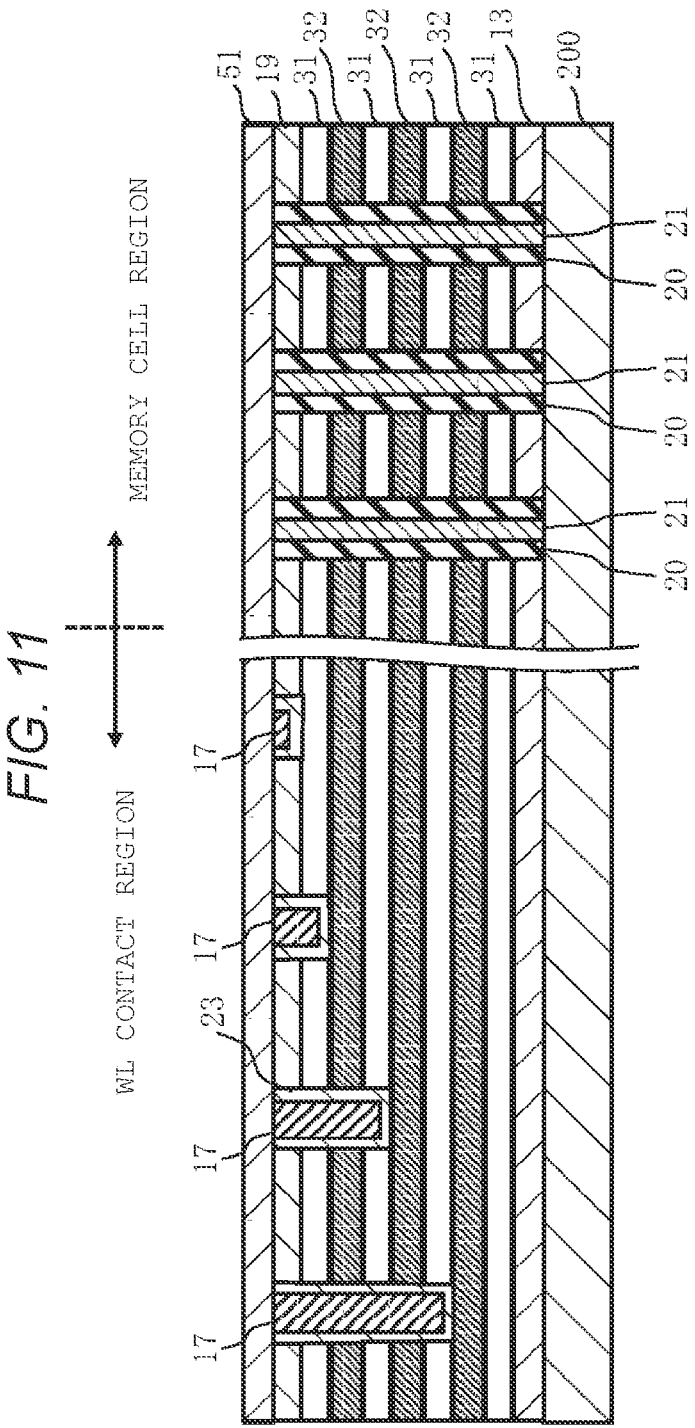
FIG. 11 is a cross-sectional view illustrating additional aspects of a semiconductor device manufacturing method according to a first embodiment.

FIG. 11 is a cross-sectional view illustrating additional steps of the semiconductor device manufacturing method according to the first embodiment. FIG. 11 illustrates the sacrificial film A layer etching step (S114).

In FIG. 11, as the sacrificial film A layer etching step (S114), the sacrificial films 30 are removed. The removed sacrificial films 30 are eventually replaced by the conductive layers 10 (to be described more specifically below). Specifically, the sacrificial films 30 in the memory cell region and the WL contact region are removed in an etching process to leave spaces 31. First, by wet etching (for example, hot phosphoric acid treatment), the sacrificial film 30 layers are removed. The wet etching occurs via the plurality of openings (e.g., replacement grooves or the like) formed in the opening forming step (S112). As a result, spaces 31 are formed between the adjacent sacrificial film 32 layers. In the WL contact region, struts intersecting the sacrificial film 32 layers and extending in the stacking direction are provided to serve as support members (pillars or the like) so the sacrificial film 32 layers do not collapse. In the memory cell region, the memory films 20 and the channel bodies 21 intersecting each sacrificial film 32 layer and extending in the stacking direction are capable of serving as support members (pillars) and supporting the sacrificial film 32 layers so as not to collapse.

Figures 12, 13:
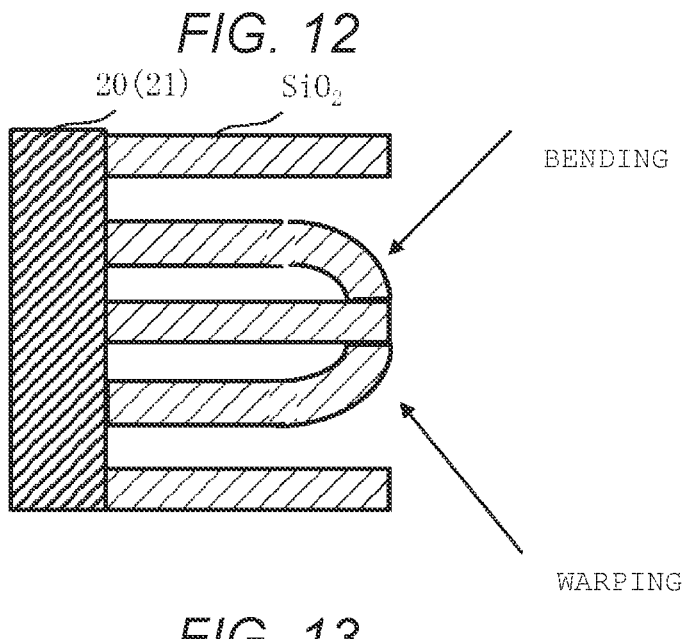
FIG. 12 is a diagram illustrating a state possible when a sacrificial film of a stacked film is removed in a comparative example.
FIG. 13 is a diagram illustrating a state possible when the sacrificial film of the stacked film is removed in a first embodiment.

FIG. 12 is a diagram illustrating an example of a state where a sacrificial film of a stacked film has been removed in a comparative example. In the comparative example, a stacked film of sacrificial film 30 layers and $SiO_2$ film layers is used. In such a stacked film of the comparative example, removal of the sacrificial film 30 layer by etching may lead to bending and warping of some of the remaining $SiO_2$ film layers as illustrated in FIG. 12. It is assumed that this is because the rigidity of the $SiO_2$ film loses to the compressive stress of the $SiO_2$ film or/and the surface tension caused by a cleaning solution or the like during the etching (removal) process. Accordingly, it is generally desirable to use a material that has a higher Young's modulus (modulus of longitudinal elasticity) than a $SiO_2$ film layer.

FIG. 13 is a diagram illustrating an example of a state where sacrificial films of the stacked film has been removed as in the first embodiment. In the first embodiment, instead of a $SiO_2$ film layer, the sacrificial film 32 layers are, for example, a carbon film. The carbon film is higher in Young's modulus than the $SiO_2$ film. Specifically, the carbon film has a Young's modulus of 80 to 100 GPa (gigapascals) or more and the $SiO_2$ film has a Young's modulus of 70 GPa. Furthermore, the carbon film does not undergo a glass transition, and thus there is no stress shift attributable to annealing at a temperature equal to or higher than the glass transition point. In addition, the thermal expansion coefficient for Si is 3.9, SiN is 2.6 to 3.5, $SiO_2$ is 0.6, and C is 3.2. Thus, the thermal expansion coefficient of carbon is relatively close to those of silicon (Si) and SiN (which is a material used for the sacrificial film 30), and thus warping at a high temperature can be reduced. As a result, as illustrated in FIG. 13, it is possible to prevent or reduce the bending and warping of the sacrificial film 32 layer after removing the sacrificial film 30 layer by etching.

The carbon film is electrically conductive and thus unsuitable as an interlayer insulating film between the conductive layers 10. Accordingly, the sacrificial film 32 layer is eventually replaced with the insulating layer 12 before the embedding of barrier metal film and conductive material in the conductive layer embedding step (S118).

Figure 14:
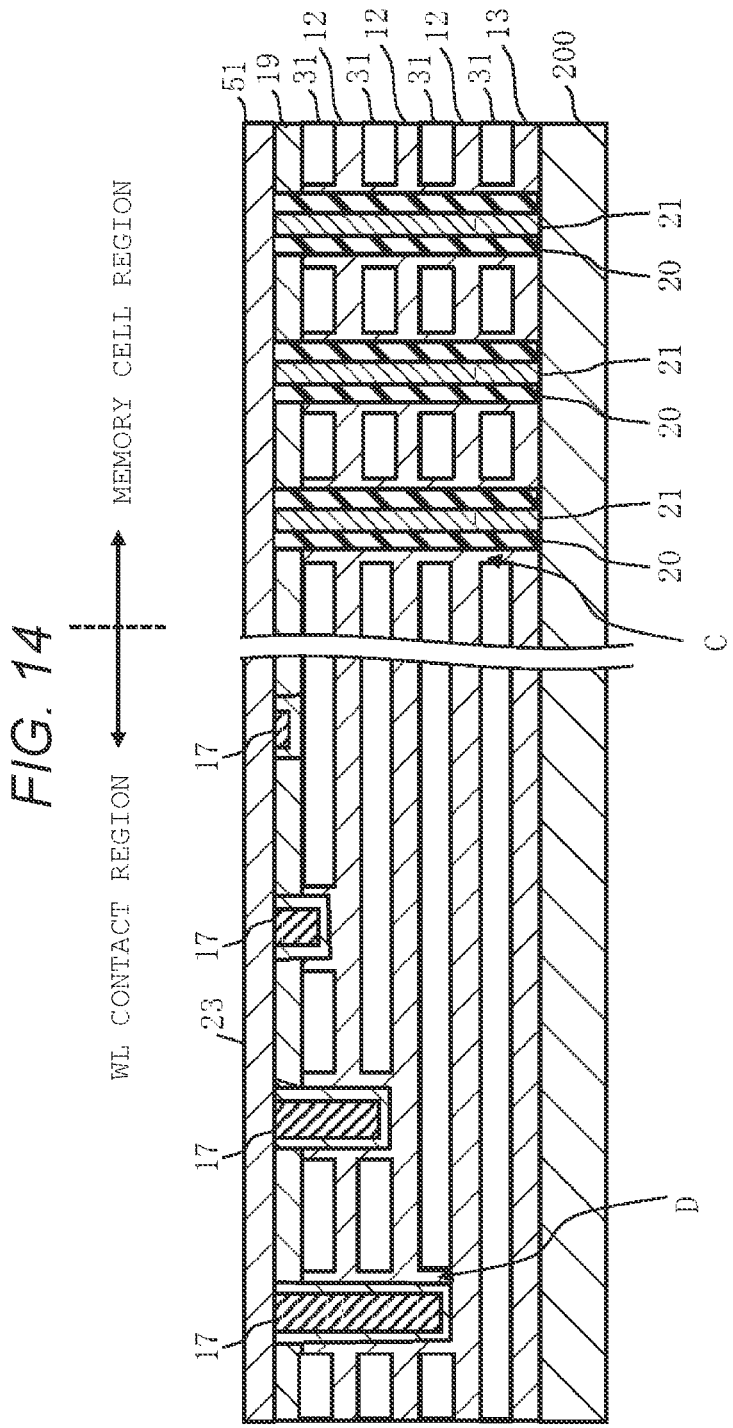
FIG. 14 is a cross-sectional view illustrating additional aspects of a semiconductor device manufacturing method according to a first embodiment.

FIG. 14 is a cross-sectional view illustrating certain steps of the semiconductor device manufacturing method according to the first embodiment. FIG. 14 illustrates the sacrificial film B layer/insulating layer replacement step (S116).

In FIG. 14, as the sacrificial film B layer/insulating layer replacement step (S116), after each sacrificial film 30 layer is removed in the sacrificial film A layer etching step (S114), the sacrificial film 32 layer is replaced by the insulating layer 12, which is implemented as follows.

Figure 15:
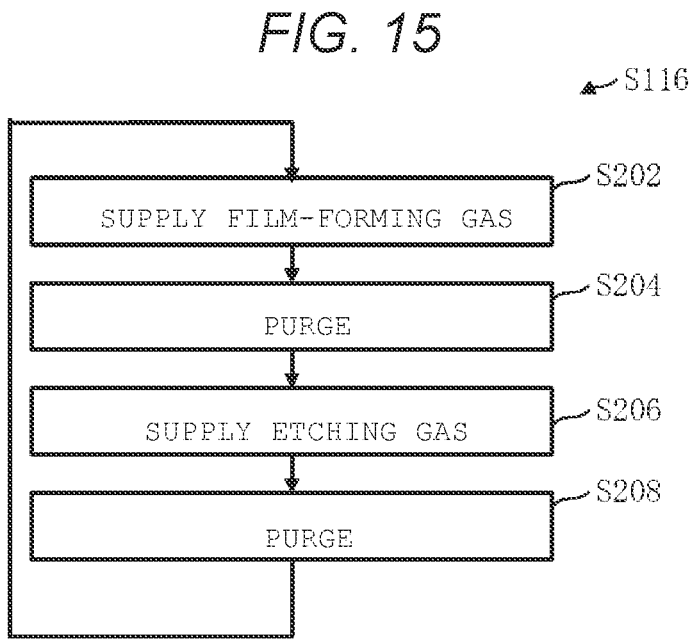
FIG. 15 is a flowchart illustrating an example of steps related to replacement of a sacrificial film layer with an insulating layer according to a first embodiment.

FIG. 15 is a flowchart illustrating an example of the steps of the sacrificial film B layer/insulating layer replacement step according to the first embodiment. In FIG. 15, in the first embodiment, for the sacrificial film B layer/insulating layer replacement step (S116), a film-forming gas supply step (S202), a purge step (S204), an etching gas supply step (S206), and a purge step (S208) are repeated as a series of steps. By alternately supplying a film-forming gas (precursor gas) and an etching gas via the spaces 31 formed by removing each sacrificial film 30, each sacrificial film 32 of the stacked film can be gradually replaced with the insulating layer 12.

Figure 16:
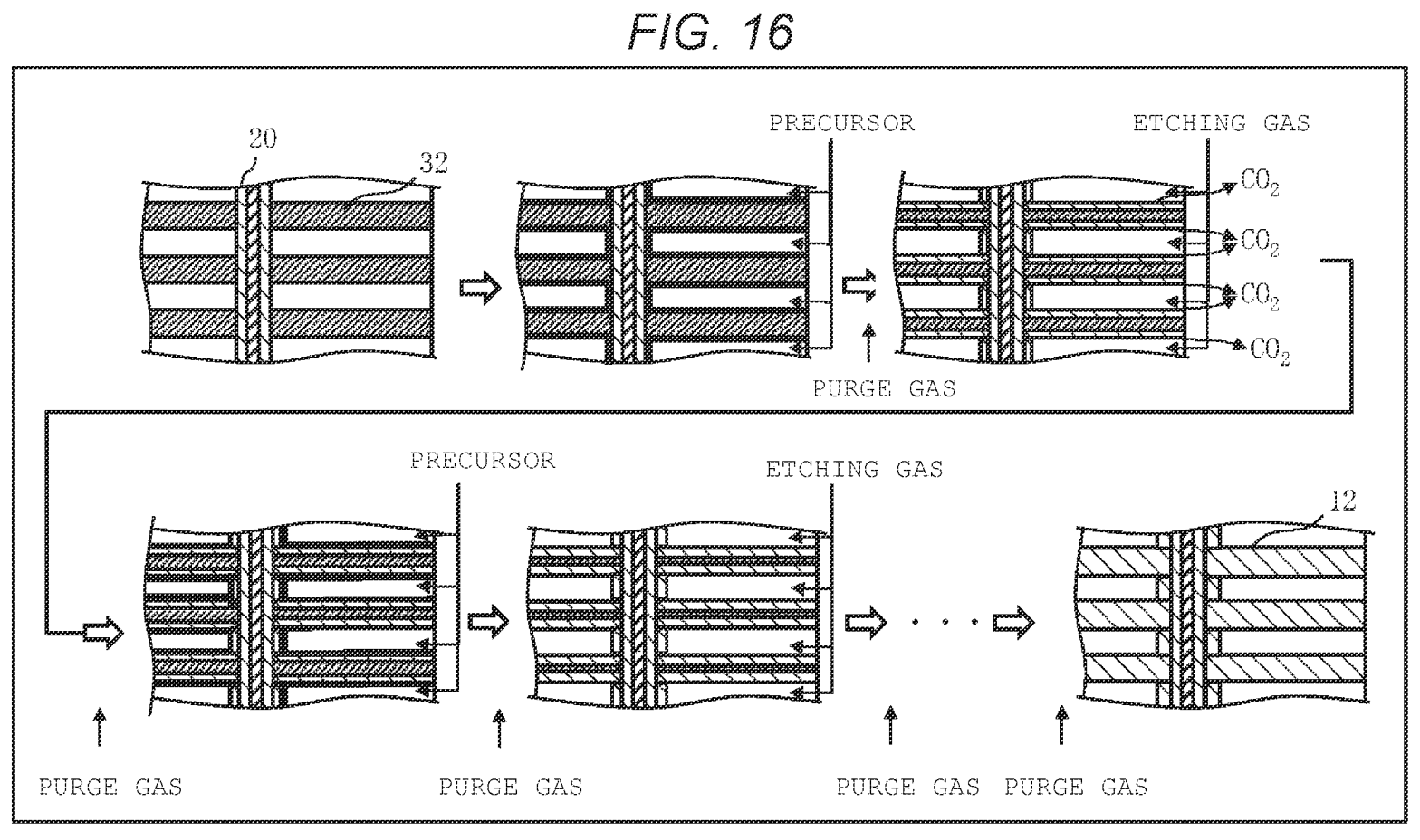

FIG. 16 is a cross-sectional view illustrating the sacrificial film B layer/insulating layer replacement step according to the first embodiment. FIG. 16 illustrates the film-forming gas supply step (S202) and the etching gas supply step (S206) illustrated in FIG. 15.

In FIG. 16, as the film-forming gas supply step (S202), the film-forming gas is supplied to the sacrificial film 32 layer by an ALD type process. The film-forming gas is supplied to the sacrificial film 32 layers via the plurality of openings (replacement grooves) formed in the opening forming step (S112). Chlorosilanes, alkyl-aminosilanes, chlorine-free and carbon-free precursors, and so on are preferably used as the material of the film-forming gas. Suitable examples of chlorosilanes include $SiH_2Cl_2$ and $Si_2Cl_6$. Suitable examples of alkyl-aminosilanes include "3DMAS" $(SiH(N(CH_3)_2)_3)$ and "BTBAS" $(SiH_2(NHtBu)_2)$. Suitable examples of chlorine-free and carbon-free precursors include $SiH_4$, "TSA" $(N(SiH_3)_3)$, and "NPS" $((SiH_3)_4Si)$. The film-forming gas becomes a precursor material and is adsorbed on the exposed surfaces of the sacrificial film 32 layer.

In FIG. 16, as the purge step (S204), a purge gas is supplied and the non-adsorbed film-forming gas is discharged. Nitrogen $(N_2)$ gas, argon (Ar) gas, or the like is preferably used as the purge gas.

In FIG. 16, as the etching gas supply step (S206), an etching gas is supplied. The etching gas etches portions of the sacrificial film 32 layer. When carbon is used as the sacrificial film 32, etching can be performed by oxidizing the carbon. Accordingly, the etching gas is preferably an oxidizing agent such as oxygen $(O_2)$, ozone $(O_3)$, water $(H_2O)$, or hydrogen peroxide $(H_2O_2)$. Alternatively, plasmas of oxygen, nitrous oxide $(N_2O)$, carbon dioxide $(CO_2)$, or $H_2O$ can be used. The etching gas also functions as an oxidizing agent that oxidizes and/or decomposes the precursor. As a result, the precursor adsorbed on the front and rear surfaces of the sacrificial film 32 layer becomes a $SiO_2$ film while the carbon inside becomes a $CO_2$ gas and is desorbed from the remaining (as yet unetched) sacrificial film 32.

In FIG. 16, as the purge step (S208), the purge gas is supplied and the etching gas is discharged.

The film-forming gas supply step (S202), the purge step (S204), the etching gas supply step (S206), and the purge step (S208) can be repeatedly performed in the same chamber as a series of steps until the sacrificial film 32 is replaced.

In this process, the substrate (wafer) temperature is set to 100 to 800° C. in a vacuum environment while the film-forming and etching gases are alternately supplied. Specifically, the temperature is preferably set to be equal to or higher than a temperature at which the precursor can be oxidized and water evaporates but lower than a temperature at which the precursor does not self-decompose. By repeating the film-forming gas supply step (S202), the purge step (S204), the etching gas supply step (S206), and the purge step (S208) as a series of steps, replacement with the insulating layer 12 can proceed from the front and rear surface sides of the sacrificial film 32 layer.

Via this processing, a $SiO_2$ film can be formed as the insulating layer 12. As a result, the sacrificial film 32 layer can be replaced with the insulating layer 12 as illustrated in FIG. 14. In this manner, the insulating layer 12 formed by replacing the sacrificial film 32 layer after the sacrificial film 30 has been removed is not exposed to the wet etchant used for etching the sacrificial film 30, and thus the insulating layer 12 does not undergo bending attributable to surface tension or the like in such a wet process.

It is noted in the described replacement process that the film-forming gas will also be adsorbed on the exposed surface of the memory film 20 and the exposed surfaces of the insulating films 23 on the side walls of the contact holes 150a to 150d. The etching gas will oxidize and decompose the precursor adsorbed on the exposed surfaces of the memory film 20 and the insulating films 23 on the side walls of the contact holes 150a to 150d. As a result, the insulating film (portion C) is formed on the side surface of the memory film 20 as illustrated in FIG. 14. Likewise, the insulating film (portion D) is formed on the side surfaces of the insulating films 23 on the side walls of the contact holes 150a to 150d. Here, in the replacement of the sacrificial film 32 layer with the insulating layer 12, the replacement with the insulating layer 12 proceeds from both the front surface side and the rear surface side of the sacrificial film 32 layer. Accordingly, on the side surface of the memory film 20 and the side walls of the contact holes 150a to 150d, the insulating films (portions C and D) can be formed with a film thickness that is, for example, approximately ½ of the film thickness of the insulating layer 12.

In addition, in the first embodiment, the insulating layer 13 is disposed beneath the lowermost sacrificial film 30, the insulating layer 19 is disposed on the uppermost sacrificial film 30, and thus both the front and rear surfaces of each sacrificial film 32 can be adjacent to the sacrificial film 30. In other words, when the sacrificial film 30 layer is removed, the insulating layer 13 where only the front surface side serves as the space 31 and the insulating layer 19 where only the rear surface side serves as the space 31 are film-formed of an insulating material such as a $SiO_2$ film from the beginning instead of the sacrificial film 32. As a result, it is possible to prevent a carbon residue being left after the replacement of the sacrificial film 32 layer is completed.

Although replacing the sacrificial film 32 with a $SiO_2$ film is described in the above example, the present disclosure is not limited thereto. For example, the sacrificial film 32 can be replaced with a SiON film. The film-forming gas used in such a case can be the same as in the case of replacement with the $SiO_2$ film with the addition of ammonia ($NH_3$) as a nitriding agent in the etching gas in addition to the oxidizing agent. Alternatively, it may be preferable to supply a plasma of $NH_3$ and/or $N_2$.

Figure 17:
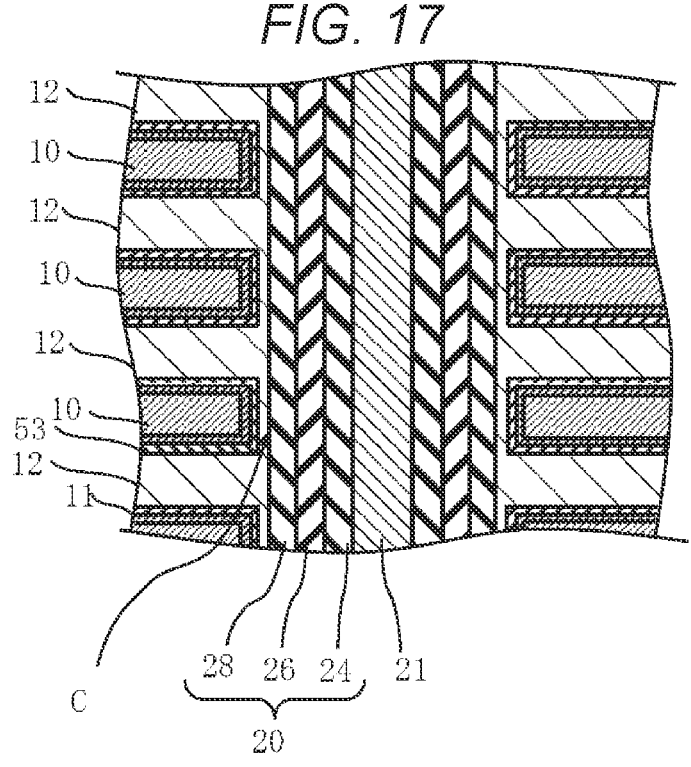
FIG. 17 is a cross-sectional view illustrating another example of a memory cell region according to a first embodiment.

FIG. 17 is a cross-sectional view illustrating another example of the configuration of the memory cell region in the first embodiment. FIG. 17 illustrates a state after the conductive layer has been formed. Prior to the formation of the conductive layers 10 and following the replacement with the insulating layer 12 in the sacrificial film B layer/insulating layer replacement step (S116), it may also be preferable to form high-dielectric constant (high-k) films 53 in the spaces 31 between the respective insulating layers 12 using the same chamber, via the replacement grooves, and by ALD or the like. A metal oxide film such as aluminum oxide ($Al_2O_3$) can be used as the material of the high-dielectric constant film 53. As a result, the high-dielectric constant film 53 functioning as a part of a block insulating film can be formed on each of the insulating layers 12, 13, and 19, the insulating film (portion C), and the insulating film (portion D) exposed to the spaces 31. It is noted that the high-dielectric constant film 53 is not specifically illustrated in FIGS. 2 and 3, but may be considered present as depicted in FIG. 17.

Figure 18:
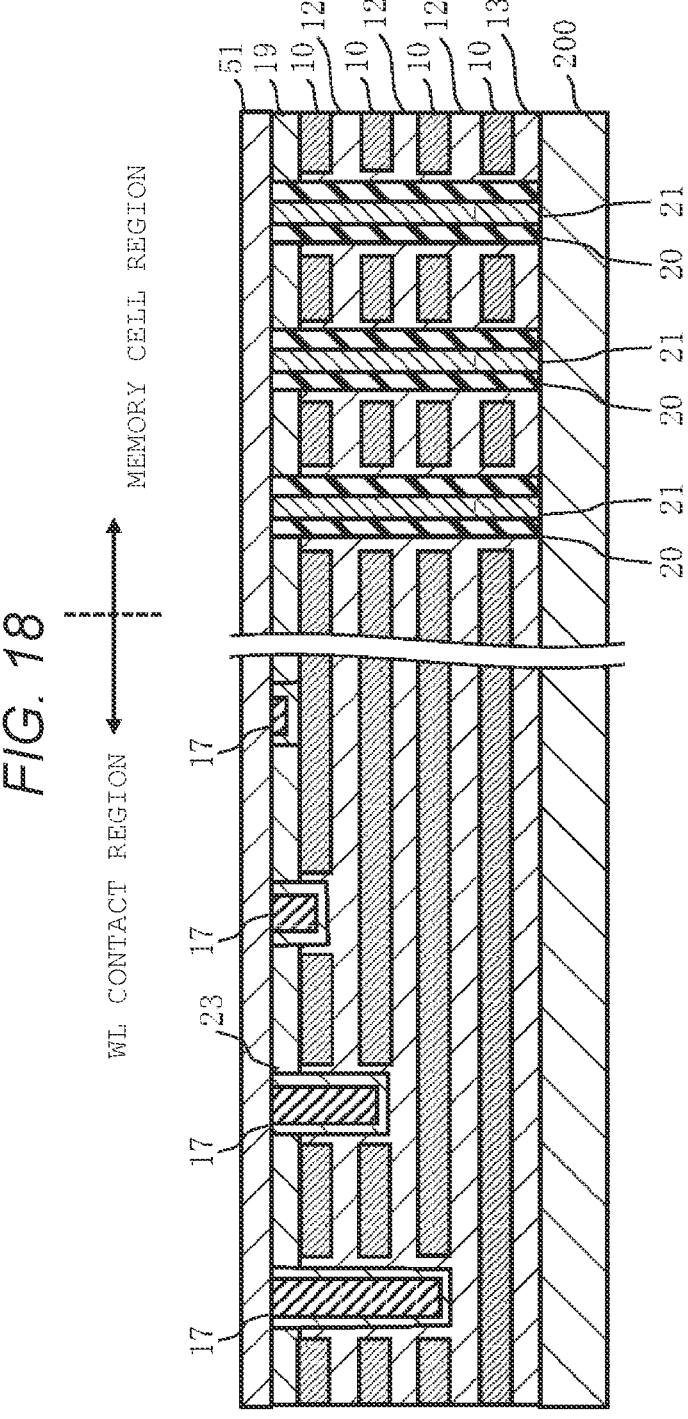
FIG. 18 is a cross-sectional view illustrating additional aspects of a semiconductor device manufacturing method according to a first embodiment.

FIG. 18 is a cross-sectional view illustrating certain steps of the semiconductor device manufacturing method according to the first embodiment. FIG. 18 illustrates the conductive layer embedding step (S118).

In FIG. 18, as the conductive layer embedding step (S118), after sacrificial films 32 are replaced with the insulating layer 12, the conductive layer 10 is formed inside the space(s) 31 formed by removing sacrificial films 30.

Specifically, by performing ALD, ALCVD, or CVD via the plurality of openings (replacement grooves) formed in the opening forming step (S112), the barrier metal film 11 illustrated in FIG. 10 (or FIG. 17) is formed on the upper and lower wall surfaces and the side walls of the spaces 31 left between the insulating layers 12. Subsequently, by ALD, ALCVD, or CVD, a conductive material is embedded in the space 31 between the respective insulating layers 12 and the conductive layer 10 is formed. It may be preferable to use TiN as the material of the barrier metal film 11. In addition, it may be preferable to use tungsten (W) as the conductive material of the conductive layers 10.

Figure 19:
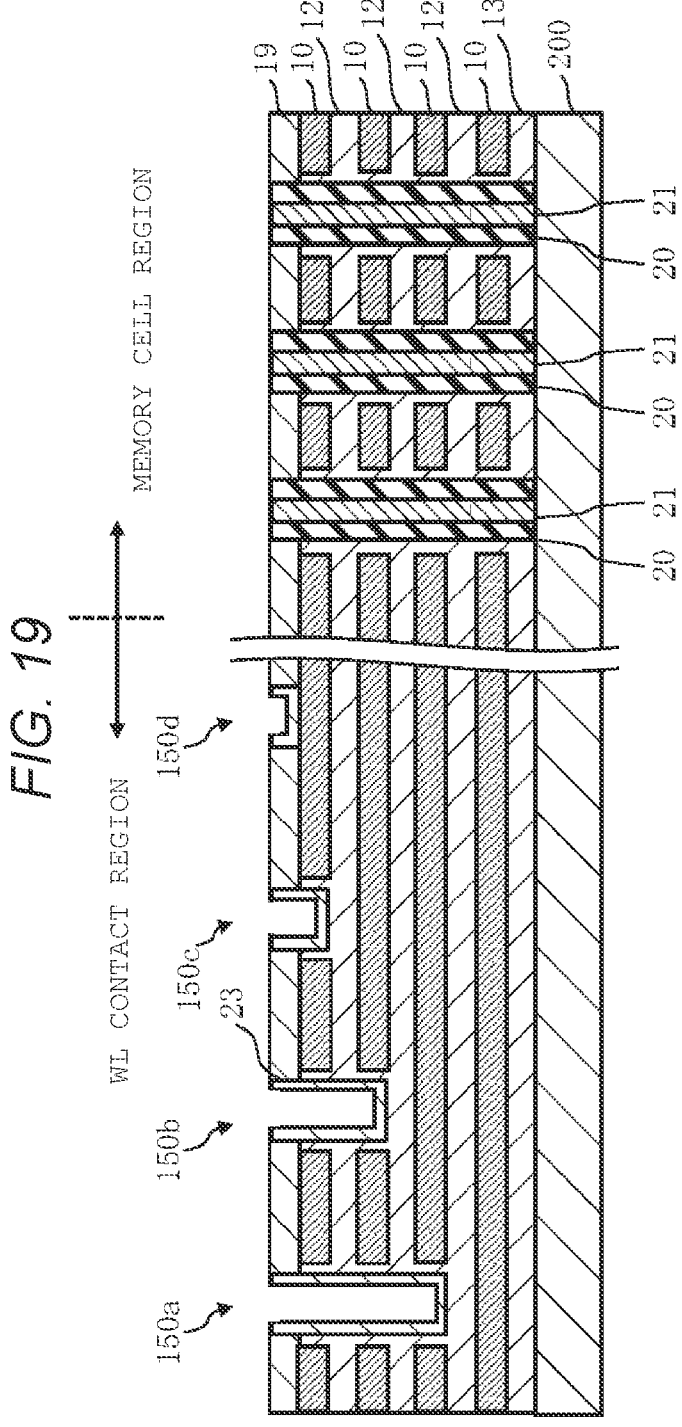
FIG. 19 is a cross-sectional view illustrating additional aspects of a semiconductor device manufacturing method according to a first embodiment.

FIG. 19 is a cross-sectional view illustrating certain steps of the semiconductor device manufacturing method according to the first embodiment. FIG. 19 illustrates the sacrificial film C removal step (S120).

In FIG. 19, as the sacrificial film C removal step (S120), the protective film 51 is first removed and then the sacrificial film 17 previously embedded in the contact holes 150a to 150d is removed by etching.

Next, as the spacer etching step (S122), the insulating film 23 formed in the bottom portions of the contact holes 150a to 150d is removed by etching and then one insulating layer 12 below the contact holes 150a to 150c is removed by etching. For example, the bottom surface part of the insulating film 23 and the exposed part of the insulating layer 12 therebelow may be removed by anisotropic reactive ion etching (RIE) or the like. As a result, the barrier metal film 11 covering the conductive layer 10 can be exposed on the bottom surface side of each of the contact holes 150a to 150d.

Next, as the contact forming step (S124), the barrier metal film 52 is formed by ALD, ALCVD, or CVD on the wall surfaces and the bottom surfaces in the plurality of contact holes 150a to 150d.

Then, a conductive material is embedded in the plurality of contact holes 150a to 150d. For example, tungsten is embedded in each of the contact holes 150a to 150d. As a result, as illustrated in FIG. 2, the contacts 16 are connected to the respectively corresponding conductive layers 10 at the bottom surfaces thereof. In addition, the conductive layers 10 penetrated by the contacts 16 are respectively insulated from those contacts 16 by the insulating film 23 and the insulating film (portion D) disposed on the side wall of each contact 16.

Figure 20:
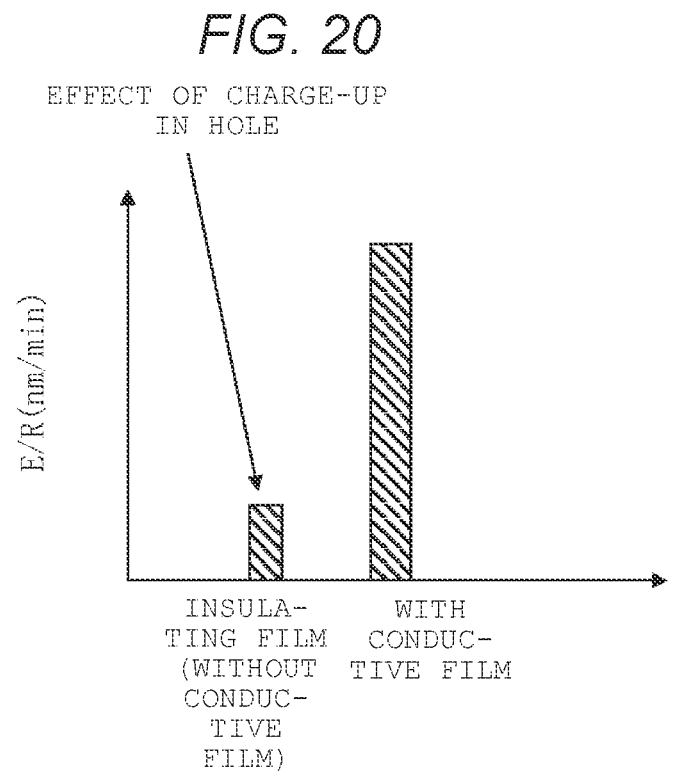

FIG. 20 is a diagram illustrating an example of the etching rates according to the first embodiment. The example of FIG. 20 illustrates the case of memory hole formation in the stacked film of an insulating layer and the sacrificial film 30 (labeled as "insulating film (without conductive film)") and the case of memory hole formation in the stacked film of a carbon film and the sacrificial film 30 (labeled as "with conductive film"). When a memory hole is formed by plasma etching such as RIE, the insulating layer in the hole becomes charged. The etching rate (E/R) is affected by such charging and decreases. In contrast, in the first embodiment, stacked films are stacked with a conductive carbon film interposed therebetween, and thus accumulated charges can be released via the carbon film. Accordingly, charging is less likely to occur. As a result, the etching rate can be improved when forming a memory hole by plasma etching such as RIE. In the example of FIG. 20, it can be seen that the etching rate is improved (increased) by a factor of four or so relative to the case of processing the stacked film of the insulating layer and the sacrificial film 30. The etching rate can be similarly improved when forming a contact hole.

In addition, the reach of the etchant in the sacrificial film A layer etching step (S114) described above is controlled by the etching time. The etching time can be controlled (set) such that the sacrificial film 30 layers in the memory cell region and the WL contact region are removed. Meanwhile, in the invalid region, the replacement groove is not formed or an insulating film or the like would be embedded when the replacement groove is formed. Accordingly, a sacrificial film 30 layer that could not be removed in the etching time will still remain in the invalid region. In other words, in the invalid region, there is a limit position (replacement limit position) up to where the sacrificial film 30 layer can be removed as illustrated in FIG. 3. On the BL contact region side beyond the limit position, the sacrificial film 30 layer remains, and the space 31 formed by the removal of the sacrificial film 30 layer will not be formed. Accordingly, the sacrificial film 32 layer can not be replaced with the insulating layer 12 in the sacrificial film B layer/insulating layer replacement step (S116) either. As a result, in the invalid region, the stacked body of the plurality of conductive layers 10 and the plurality of insulating layers 12 and the stacked body of the plurality of sacrificial film 30 layers and the plurality of sacrificial film 32 layers are adjacent in the y direction as illustrated in FIG. 3.

The contact 40 is preferably formed when the contact 16 is formed, that is, in the same process. The embedding of the insulating film 152 is performed after the conductive layer 10 has been formed.

As described above, according to the first embodiment, it is possible to prevent bending and warping of the insulating layer 12 of a stacked film.

The present disclosure is not limited to the above specific examples. For example, instead of the BL contact region (and a part of the invalid region) between the two memory cell regions or in addition to the BL contact region between the two memory cell regions, the region that includes the stacked body of the sacrificial film 30 layer and the sacrificial film 32 layer may be disposed at, for example, beyond the outer edge of the limit position where the sacrificial film 30 layer can be removed near the end portion of the memory cell array including the memory cell region and the WL contact region.

In addition, as for the film thickness of each film, the size, shape, and the number of openings, and so on, those desired for semiconductor integrated circuits and various semiconductor elements can be appropriately selected and used.

In addition, any semiconductor device that incorporates elements of the described embodiments of the present disclosure and may be appropriately modified to correspond to the present disclosure.

Although techniques commonly used in the semiconductor industry, such as photolithography processes, pre-treatment cleaning, and post-treatment cleaning, are omitted for simplicity of description, such techniques can be included as necessary in view of these of ordinary skill in the art.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device manufacturing method, comprising:
   forming a stacked film with alternating first-type sacrificial layers and second-type sacrificial layers;
   removing the first-type sacrificial layers from the stacked film to leave the second- type sacrificial layers with spaces therebetween;
   replacing each of the second-type sacrificial layers with insulating layers after removing the first-type sacrificial layers, the insulating layers have a different composition from the second-type sacrificial layers; and
   after the second-type sacrificial layers are replaced with the insulating layers, forming a conductive layer in the spaces formed by removing the first-type sacrificial layers.

2. The semiconductor device manufacturing method according to claim 1, wherein a carbon film is used as the second-type sacrificial layers.

3. The semiconductor device manufacturing method according to claim 1, wherein the second-type sacrificial layers are replaced with the insulating layers by a process sequence in which supplying a film-forming gas is alternated with supplying of an etching gas, the film-forming gas and the etching gas being supplied via the spaces formed by removing the first-type sacrificial layers.

4. The semiconductor device manufacturing method according to claim 3, wherein the process sequence in which the film-forming gas and the etching gas are supplied in alternation occurs in the same process chamber.

5. The semiconductor device manufacturing method according to claim 3, wherein at least one of a chlorosilane, an alkyl-aminosilane, or a chlorine-free, carbon-free precursor is used for the film-forming gas.

6. The semiconductor device manufacturing method according to claim 5, wherein an oxidizing agent is used for the etching gas.

7. The semiconductor device manufacturing method according to claim 1, wherein the insulating layers replacing the second-type sacrificial layers is silicon oxide or silicon oxynitride.

8. The semiconductor device manufacturing method according to claim 1, wherein the second-type sacrificial layers have Young's modulus greater than the insulating layers.

9. The semiconductor device manufacturing method according to claim 1, wherein silicon nitride is used for the first-type sacrificial layers.

10. The semiconductor device manufacturing method according to claim 1, wherein the first-type sacrificial layers are removed by wet etching.

11. The semiconductor device manufacturing method according to claim 1, wherein the replacing of the second-type sacrificial layers with insulating layers includes changing a chemical composition of the second-type sacrificial layers.

12. The semiconductor device manufacturing method according to claim 1, wherein the insulating layers are at the same height positions as the second-type sacrificial layers after the replacing.

* * * * *